(12) United States Patent
Seo

(10) Patent No.: US 6,368,673 B1
(45) Date of Patent: Apr. 9, 2002

(54) METHOD FOR SELECTIVELY HEATING A CONDUCTIVE THIN FILM ON AN INSULATING SUBSTRATE BY USE OF AN INDUCED CURRENT

(75) Inventor: Yong-Woon Seo, Kyunggi-do (KR)

(73) Assignee: ITM Platron Co., Inc. (KR)

( * ) Notice: Subject to any disclaimer, the term of this patent is extended or adjusted under 35 U.S.C. 154(b) by 0 days.

(21) Appl. No.: 09/688,491

(22) Filed: Oct. 16, 2000

(30) Foreign Application Priority Data

Oct. 15, 1999 (KR) ............................................ 99-44828

(51) Int. Cl.[7] ................................................ B01J 19/08

(52) U.S. Cl. ................. 427/457; 427/248.1; 427/398.1; 427/591; 427/598

(58) Field of Search ................................ 427/457, 591, 427/248.1, 398.1

Primary Examiner—Bernard Pianalto
(74) Attorney, Agent, or Firm—Dilworth & Barrese, LLP

(57) ABSTRACT

A method for forming a conductive thin film on an insulating substrate, particularly, a method for selectively heating to conductive thin film on an insulating substrate by using of an induced current is disclosed. The method for forming a conductive thin film on an insulating substrate is characterized by installing a heating means at a predetermined distance from the insulating substrate in a vacuum chamber or on a surface of the insulating substrate opposite to a surface to be formed the conductive thin film for generating Joule heat by inducing currents on the conductive thin film generated by a means for generating alternating magnetic fluxes due to current change and selective heating of the conductive thin film by the heating means during forming the conductive thin film. The selective heating and accelerating particles to be formed the conductive thin film are executed simultaneously or alternatingly. It is preferable to utilize a cooling means for protecting the insulating substrate from temperatures generated by heat during the conductive thin film forming step by wholly or partly contacting a copper plate or a copper plate coated with chrome by a predetermined thickness on a surface of the insulating substrate. Due to this present invention, it is possible to selectively heat a conductive thin film formed on an insulating substrate without any deformation of the insulating substrate and to broaden a possibility for choosing material of the insulating substrate, therefore it is possible to form a functional thin film having a high quality on an insulating substrate in various fields of industry.

11 Claims, 3 Drawing Sheets

PULSE OR ALTERNATING CURRENT SOURCE (a) (SELECTIVE HEATING)

(b) (THIN FILM FORMING)

METHOD FOR SELECTIVELY HEATING A CONDUCTIVE THIN FILM ON AN INSULATING SUBSTRATE BY USE OF AN INDUCED CURRENT

BACKGROUND OF THE INVENTION

1. Field of the Invention

The present invention relates to a method for forming a conductive thin film on an insulating substrate, and more particularly to a method for selectively heating the conductive thin film material onto an insulating substrate by use of an induced current.

2. Description of the Related Art

Today, as the telecommunication, electronic control and computer technologies based on semiconductor technology continue to develop, electronic products continue to become lighter, thinner, smaller and more portable.

In the process of designing more portable products, durability and safety should be considered. For example, if a display panel of a conventional mobile telephone is made of glass, it will therefore weigh more and there are safety hazards as the display may be shattered by external shock.

Therefore, various methods have been considered to construct the display panel out of lighter material such as plastic in order to solve the above problems. But so far, it is very difficult to form a functional conductive thin film on a plastic substrate as the temperature at which a plastic substrate deforms by heat, e.g. about 120° C., is lower than the temperature required to form the functional conductive thin film on the plastic substrate.

SUMMARY OF THE INVENTION

The present invention was devised to solve the above-noted problems and it is an object of this invention to provide a method for forming a conductive thin film on an insulating substrate at lower temperatures by selectively heating the conductive thin film through the use of an induced current.

BRIEF DESCRIPTION OF THE DRAWINGS

The object, other features and advantages of the present invention will become more apparent by describing the preferred embodiment thereof with reference to the accompanying drawings, in which.

DETAILED DESCRIPTION OF THE INVENTION

The present invention relates to a method for forming in a vacuum chamber a conductive thin film on an insulating substrate. By installing a heating means, positioned at a predetermined distance from the insulating substrate or on a back surface of the insulating substrate opposite to a front surface on which the conductive thin film is to be deposited, Joule heat is generated due to the induced currents on the conductive thin film. The heat is generated by the presence of alternating magnetic fluxes due to current changes. The selective heating of the conductive thin film by the heating means allows the formation of the conductive thin film on the substrate at lower temperatures.

The alternating magnetic fluxes are generated by supplying pulses or alternating currents to the alternating magnetic flux generating means and the Joule heat generated on the conductive thin film is proportional to the square of the derivative of the magnetic flux per unit of time, $$\left(\frac{\partial B}{\partial t}\right)^2,$$

and is inversely proportional to the current density, $\square$.

It is preferable that the alternating magnetic flux generating means is a conventional wire or thin film type wire and more preferable that the alternating magnetic flux generating means is installed on the back surface of the insulating substrate.

A method for forming the conductive thin film in accordance with an embodiment of the present invention may include a process for accelerating the conductive particles vaporized from the source (8) to form the conductive thin film by supplying a biasing voltage and selecting at least one of the accelerating step and the selective heating step by controlling a duration time and timing the accelerating step and the selective heating step accordingly.

In a first embodiment, it is preferable that the accelerating step and the selective heating step are simultaneously executed. In a second embodiment the selective heating step can be independently performed from any accelerating step. And in a third embodiment the accelerating step and the selective heating step are alternatively executed. In the third embodiment, the case of alternatingly performing the two steps, it is more preferable to not have any overlap in the performance of the two steps.

It is preferable that a cooling means is provided to prevent the temperature of the insulating substrate from rising to a point that would deform the substrate during said conductive thin film forming. One method of preventing overheating is by wholly or partly contacting a copper plate or a copper plate coated with chrome by a predetermined thickness to the back surface of said insulating substrate.

Figure 1:
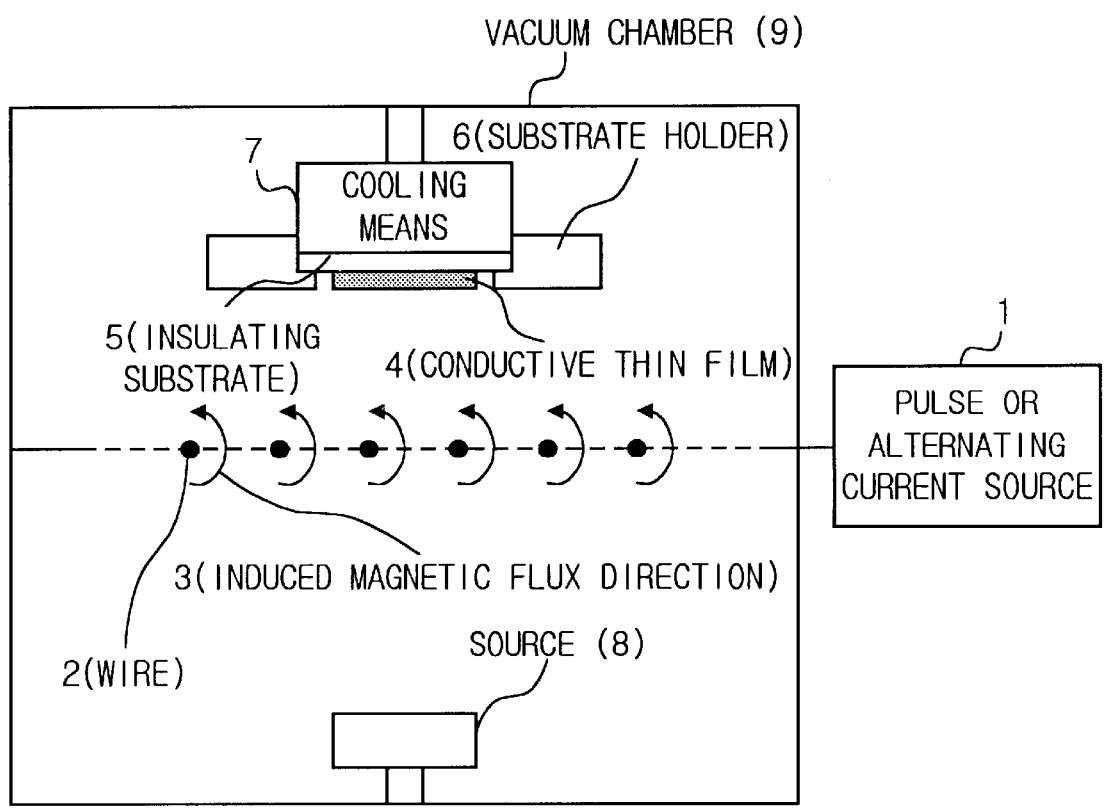
FIG. 1 is a block diagram depicting an embodiment of the selective heating apparatus of the present invention.

FIG. 1 illustrates an embodiment of a selective heating apparatus according to one embodiment of the present invention. The process occurs in a vacuum chamber (9). In FIG. 1 the selective heating is accomplished by inputting pulses or an alternating current, supplied by a source (1), through a series of wires (2) as the alternating magnetic flux generating means, which induces alternating magnetic fluxes (3) around each wire. The insulating substrate (5) on which the conductive thin film (4) is to be formed is fixed in place by a substrate holder (6). The substrate holder (6) maintains contact between the insulating substrate (5) and a cooling means (7).

As embodied in the first and second embodiments of the present invention, it is possible that the selective heating step is either simultaneously or alternately executed with the accelerating step for accelerating particles to be formed as the conductive thin film is vaporized from a source (8) by biasing the voltage.

Figure 2:
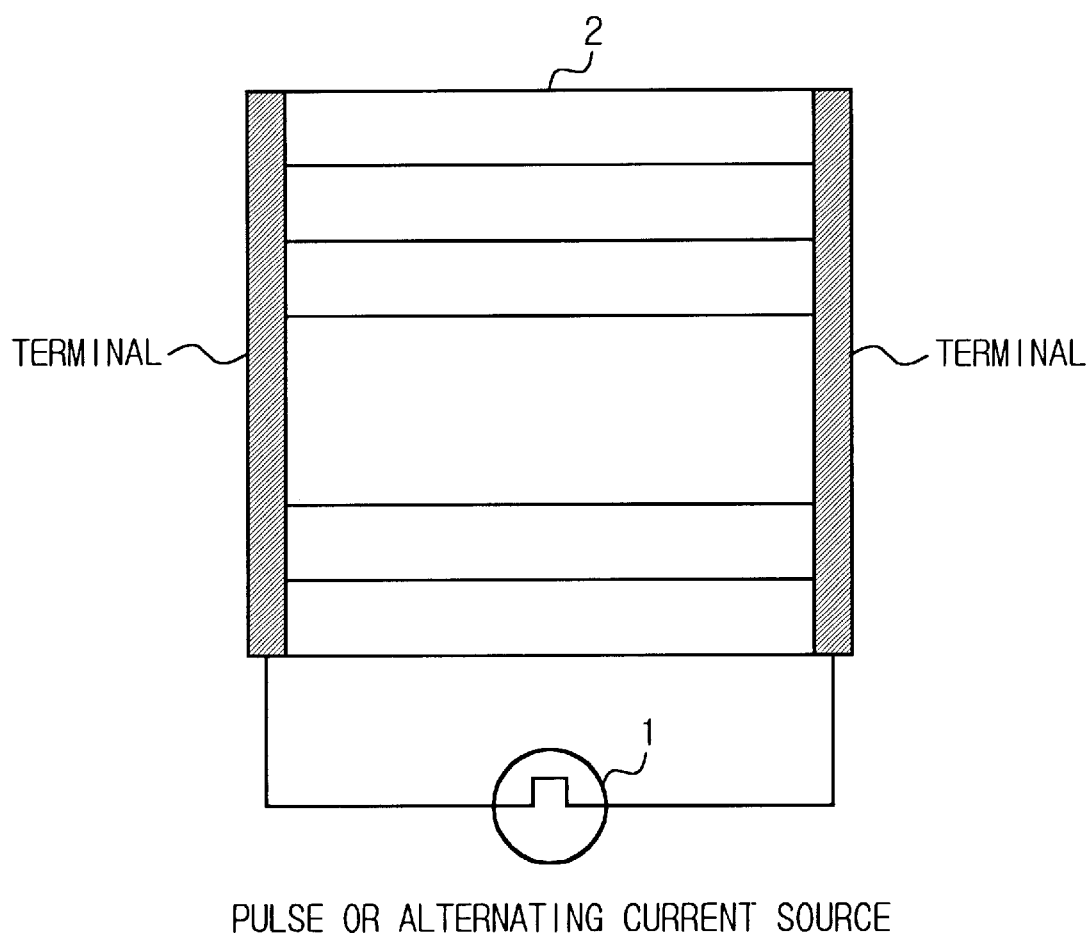
FIG. 2 is a block diagram depicting an electric connection diagram of an alternating magnetic flux generating means in accordance with the FIG. 1.

FIG. 2 illustrates an electrical wiring diagram of an alternative magnetic flux generating means. An induced magnetic flux is generated on the wire by inputting pulses or an alternating current to both terminals located at the end of the wire.

Figure 3:
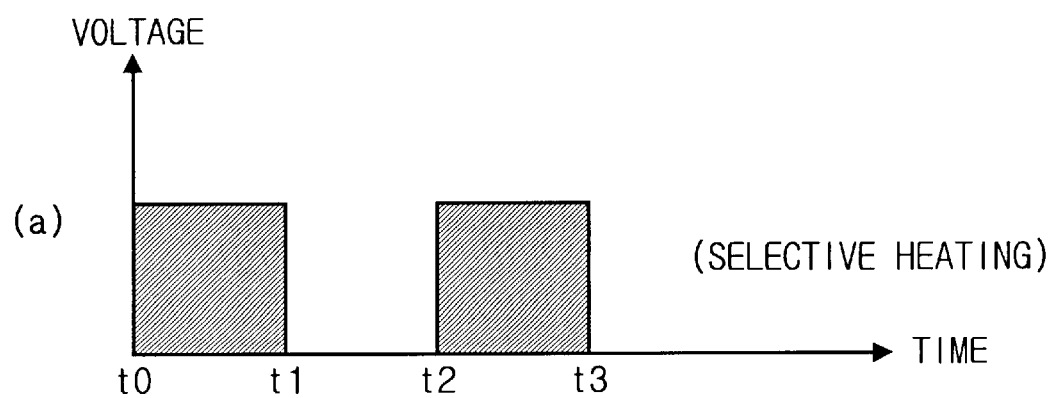
FIG. 3 is a graph of the voltage versus time for alternatively accelerating particles to be formed to conductive thin film and a selective heating of a conductive thin film formed on an insulating film in accordance with an embodiment of the present invention.
Figure 3:
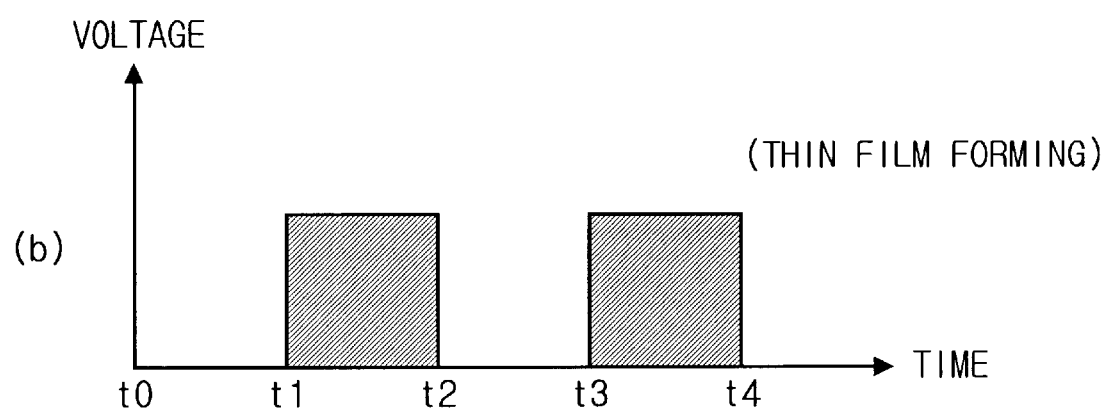

FIG. 3 is a graph of the voltage versus time for alternatingly executing the particle accelerating step and the selective heating step according to an embodiment of the present invention. In FIG. 3, the selective heating step is executed at time t0 for a predetermined time t0 to t1. Then the accelerating step is executed for a predetermined time from t1 (the time the selective heating step ends) to t2. The selective heating step is executed again at time t2 for a predetermined duration t2 to t3. The process continues repeating these two steps until the desired amount of conductive thin film is deposited on the substrate.

But it is not necessary to coincide the starting and ending periods of these two steps for the process to work. The steps can overlap.

As a result of the present invention, it is possible to selectively heat a conductive thin film formed on an insulating substrate without any deformation of the insulating substrate and to broaden a possibility for choosing the material of the insulating substrate. Therefore it is possible to form a functional conductive thin film having a high quality on an insulating substrate in various fields of industry.

What is claimed is:

1. A method for forming a conductive thin film on an insulating substrate, said method comprising the steps of:

installing said insulating substrate in a vacuum chamber;

installing a heating means at a predetermined distance from said insulating substrate in said vacuum chamber or on a back surface of said insulating substrate opposite to a front surface on which said conductive thin film is to be formed for generating Joule heat by inducing current on the conductive thin film generated by a means for generating alternating magnetic fluxes due to current changes;

forming said conductive thin film on a surface of the insulating substrate; and selectively heating said conductive thin film by using the heating means during said forming of said conductive thin film.

2. The method as set forth in claim 1, wherein said alternating magnetic fluxes are generated by supplying at least one of pulses and alternating currents to the alternating magnetic flux generating means.

3. The method as set forth in claim 2, wherein the alternating magnetic flux generating means is at least one of a conventional wire and a thin film type wire.

4. The method as set forth in claim 3, wherein said method further comprises the steps of:

accelerating particles vaporized from a source to form the conductive thin film by supplying a biasing voltage; and selecting at least one of said accelerating step and said selective heating step by controlling the operation time and the timing of said accelerating step and selective heating step.

5. The method as set forth in claim 4, wherein said insulating substrate is cooled to a constant temperature by a separate cooling means.

6. The method as set forth in claim 5, wherein said cooling means prevents the temperature of said insulating substrate from rising above a predetermined temperature during said conductive thin film forming, said cooling means including one of a copper plate and a copper plate coated with chrome by a predetermined thickness being wholly or partly in contact with a surface of said insulating substrate.

7. The method as set forth in claim 5, wherein said accelerating step and selective heating step are performed simultaneously.

8. The method as set forth in claim 5, wherein only said selective heating step is performed.

9. The method as set forth in claim 5, wherein said accelerating step and selective heating step are alternatingly performed.

10. The method as set forth in claim 9, wherein the performance of one of the accelerating and selective heating steps occurs without any overlap in the performance of the other step.

11. The method as set forth in claim 9, wherein the performance of the accelerating and selective heating steps occurs with an overlap in their performance.

* * * * *